United States Patent
Burdick, Jr. et al.

(10) Patent No.: US 7,403,011 B2
(45) Date of Patent: Jul. 22, 2008

(54) SELF-SHIELDED PACKAGING FOR CIRCUITRY INTEGRATED WITH RECEIVER COILS IN A IMAGING SYSTEM

(75) Inventors: William E. Burdick, Jr., Niskayuna, NY (US); Richard Louis Frey, Delanson, NY (US); James Enrico Sabatini, Glenville, NY (US)

(73) Assignee: General Electric Company, Niskayuna, NY (US)

( * ) Notice: Subject to any disclaimer, the term of this patent is extended or adjusted under 35 U.S.C. 154(b) by 168 days.

(21) Appl. No.: 11/352,833

(22) Filed: Feb. 13, 2006

(65) Prior Publication Data

US 2007/0188175 A1      Aug. 16, 2007

(51) Int. Cl.
*G01V 3/00*      (2006.01)
(52) U.S. Cl. ...................................... 324/318; 324/319
(58) Field of Classification Search ......... 324/300–322; 600/407–455
See application file for complete search history.

(56) References Cited

U.S. PATENT DOCUMENTS

| | | | |
|---|---|---|---|
| 4,564,812 A * | 1/1986 | Van Dijk | 324/309 |
| 6,130,881 A * | 10/2000 | Stiller et al. | 370/238 |
| 6,218,836 B1 | 4/2001 | Vrijheid | |
| 6,396,153 B2 | 5/2002 | Fillion et al. | |
| 6,462,976 B1 | 10/2002 | Olejniczak et al. | |
| 6,566,596 B1 | 5/2003 | Askew | |
| 6,704,592 B1 | 3/2004 | Reynolds et al. | |
| 6,882,547 B2 | 4/2005 | Arz | |
| 6,998,842 B2 * | 2/2006 | Sinnema et al. | 324/318 |
| 2004/0222506 A1 | 11/2004 | Wei et al. | |
| 2006/0038562 A1 * | 2/2006 | Pittaluga et al. | 324/307 |
| 2007/0182409 A1 * | 8/2007 | Varjo | 324/304 |

OTHER PUBLICATIONS

Raza, Ishfaqur, "Faraday Cage Enclosures and Reduction of Microprocessor Emissions", http://www.ce-mag.com/archive/01/Spring/Raza.html, 9 pages.

* cited by examiner

*Primary Examiner*—Brij B Shrivastav
(74) *Attorney, Agent, or Firm*—Jason K. Klindtworth

(57) ABSTRACT

An improved magnetic resonance (MR) imaging system (10) is provided. A plurality of receiver coils (12) may be configured to supply respective coil output signals based on a plurality of magnetic resonance response signals sensed by the receiver coils. Each receiver coil defines an enclosure constituting a Faraday cage. At least one circuit device (22) is disposed in the enclosure (24) to condition the coil output signal. This enclosure enables the circuit device (22) to be shielded from electromagnetic interference.

23 Claims, 3 Drawing Sheets

SELF-SHIELDED PACKAGING FOR CIRCUITRY INTEGRATED WITH RECEIVER COILS IN A IMAGING SYSTEM

FIELD OF THE INVENTION

The present invention is generally related to magnetic resonance imaging (MRI), and, more particularly, to an electromagnetic interference (EMI) self-shielded packaging for electronics/devices/circuitry integrated with receiver coils in a magnetic resonance imaging system.

BACKGROUND OF THE INVENTION

In a magnetic resonance imaging (MRI) system there may be one or more, highly sensitive receiver coils, such as made up of a plurality of receiving coil elements. As is known in the art, these coil elements are generally used to receive MR response signals for a region of a subject undergoing a diagnostics MR procedure to create an MR image of that region. Each of these receiver coils may be connected to associated circuitry, such as may provide signal amplification, frequency conversion, filtering, digitization, modulation, etc. Presently there may be eight, sixteen, or 32 receiver coil elements in a typical MRI coil. It is noted, however, that this number may eventually increase to a larger number, (e.g., 64, 96, 128 coils, or more) as newer MRI systems with ever-increasing imaging resolution and speed are introduced in the market place. Thus, challenges remain in being able to compactly package such coils and associated electronics.

Because subsystems that may be part of the MRI system (such as a gradient coil system for generating a magnetic gradient field) may involve relatively large electrical currents (in the order of some hundreds of A) and high voltages (ranging from several hundreds of V to kV) with concomitant generation of radio frequency (RF) noise, and also because the amplitude of the signals detected by the receiver coils tend to be relatively weak and image quality is very dependent on electrical noise, challenges have been presented in order to appropriately shield such coil circuitry from external EMI fields. Similarly, challenges have been presented to counteract the emergence of EMI fields that can be generated by this circuitry. Furthermore, the MRI system may be subject to electromagnetic compatibility (EMC) requirements as may be imposed by regulatory agencies.

Accordingly, it is desirable to provide an MRI system and techniques that avoid or substantially reduce the above-described difficulties. More particularly, it is desirable to provide a compact and cost-effective packaging for the receiver coils and associated circuitry, in an environment substantially immune to electromagnetic interference (EMI) to achieve superior signal fidelity and ultimately produce an image virtually free of EMI-induced artifacts.

BRIEF DESCRIPTION OF THE DRAWINGS

These and other advantages of the invention will be more apparent from the following description in view of the drawings that show.

DETAILED DESCRIPTION OF THE INVENTION

By way of example, the description below focuses on a magnetic resonance imaging (MRI) system, as may be used for medical diagnostics applications. It will be understood, however, that aspects of the present invention may be used equally effective in various types of imaging applications, such as industrial inspection, security inspection, etc., and may further be used not just in an MR modality. For example, an MR plus modality, e.g., MRI in combination with other imaging modalities, such as computed tomography (CT) or positron-emission tomography (PET), may similarly benefit from aspects of the present invention. Moreover, it is contemplated that the concepts of the present invention may be broadly used to provide an electromagnetic interference (EMI) self-shielded packaging for electronics/devices/circuitry integrated within any antenna be it receiving or transmitting or both and/or sensing element configured to accommodate such electronics/devices/circuitry and provide the EMI shielding. Accordingly, it is felt that the present invention should not be limited to imaging applications being that an imaging application just represents one exemplary embodiment.

Figure 1:
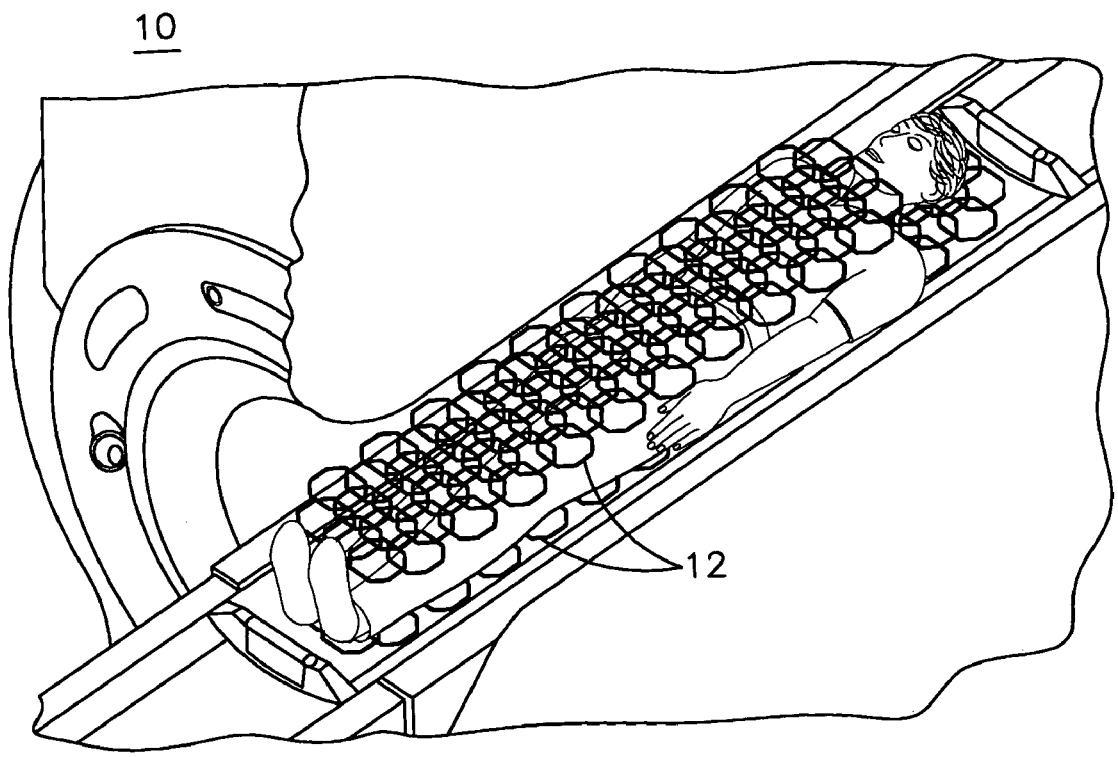
FIG. 1 is a cut-away, perspective view of a magnetic resonance imaging (MRI) system embodying aspects of the present invention.

FIG. 1 illustrates a cut-away, perspective view of a magnetic resonance imaging (MRI) system 10 as may embody aspects of the present invention. MRI system 10 comprises a plurality of receiver coils 12, (e.g., surface coils) as may be positioned on a subject undergoing an MRI diagnostics scan. Each receiver coil is configured to supply a respective coil output signal based on a magnetic resonance response signal sensed by the receiver coil. Using techniques well understood by those skilled in the art, each of the coil signals is processed, e.g., amplified, digitized, modulated, etc. to create an MR image of a region of interest.

Figure 2:
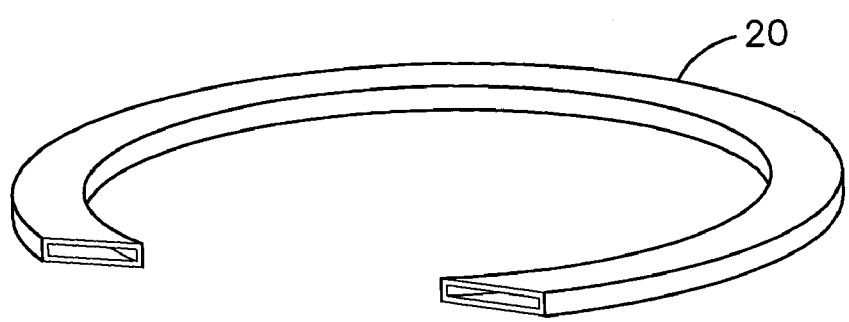
FIG. 2 is a perspective partial view of a single receiver coil element embodying aspects of the present invention.

The inventors of the present invention have recognized innovative circuit packaging and integration techniques that provide an EMI shield for one or more circuit devices associated (i.e., packaged with the receiver coils). This enables an RF noise immune environment suited for superior signal fidelity and enhanced imaging performance. As described in greater detail below, it is contemplated that aspects of the present invention will solve the issues previously encountered when operating sensitive MRI coil receiver electronics in or near a strong EMI environment by situating this circuitry inside a receiver element/coil. FIG. 2 is a perspective partial view of a single receiver element 20.

Figure 3:
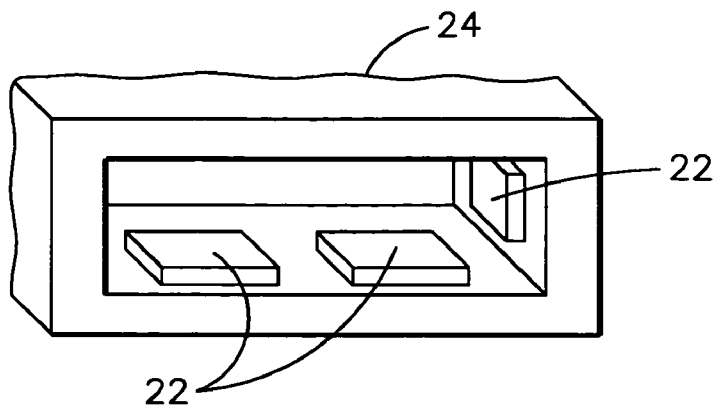
FIG. 3 is a perspective cutaway view for visualizing the interior of the receiver element shown in FIG. 2, and illustrating one or more exemplary integrated circuit (IC) devices that may be constructed within an enclosure that constitutes the receiver element.

FIG. 3 is a perspective cutaway view for visualizing the interior of the receiver element shown in FIG. 2. More particularly, FIG. 3 illustrates one or more circuit devices 22, e.g., active and/or passive circuit devices, which may be constructed within an enclosure 24 that constitutes the receiver element 20. Examples of circuit devices that may be packaged within a receiver coil to provide a desired receiver coil signal conditioning may be amplifiers as may provide a desired signal amplification, frequency converters as may provide a desired frequency conversion (e.g., down-frequency conversion, filters as may provide a desired signal filtering, analog-to-digital converters as may provide digitization, modulators for modulating signal information to be communicated over a communications data link, transmitters for transmitting data over the communications data link, etc.

It will be appreciated that the circuit devices may comprise electronic devices configured to operate on electrical signals. In addition, it is envisioned that such circuit devices may also comprise optical and electro-optical devices configured to operate on electrical and/or optical signals, such as may be used by an optical data link for optically transmitting (e.g., in free space or via optical fibers) data from the receiver coils.

It is contemplated that this EMI self-shielded circuit packaging may be accomplished by configuring the circuit devices 22 to be relatively thin and then mounting such circuit devices, directly onto a flexible multilayer substrate or film with a metal layer, e.g., a metal-on-polymer/plastic substrate or film. This substrate may be constructed to include interconnects, input and output ports, and any active and passive circuit devices that may be needed for achieving a specified system functionality. It is further contemplated that the substrate may be configured so that once the circuit devices are attached thereon, then the flexible substrate may be arranged (e.g., folded or otherwise assembled) in the form and shape of a traditional receiver element/coil or any shape suitable for a given application.

It will be appreciated that the packaging of the circuit devices within the interior defined by the receiver coil effectively constitutes a Faraday Cage around the circuit devices. That is, an electrically conductive structure around the circuit devices that prevents the entry or escape of an electromagnetic field. Accordingly, the circuit devices are substantially protected from EMI effects and the MR coil signal fidelity and resulting image quality is enhanced. Moreover, aspects of the present invention prevent EMI, or other noise that can be produced by the circuit devices within the coil from adversely effecting noise sensitive devices outside of the coil including the outside surface of the coil itself. The inventors of the present invention have elegantly recognized that the same structure that acts as a receiver coil element can also be adapted to provide a Faraday cage for the circuit devices housed within the coil element.

Examples of integrated circuit (IC) chip fabrication technologies that may be used for constructing the foregoing circuit packaging may include high density interconnect (HDI) and chip-on-flex circuit fabrication technologies. Very briefly, HDI modules may include a plurality of semiconductor integrated circuit chips and other electronic components mounted on a substrate. The chips and other electronic components may be interconnected by a multilayer interconnect structure including interleaved layers of a thin film polymer dielectric material (e.g. Kapton polyimide) and patterned metallization, with vias formed in the polymer layers. For readers desirous of general background information regarding this chip fabrication technology, reference is made to U.S. Pat. No. 6,396,153, titled "Circuit Chip Package and Fabrication Method", and commonly assigned to the same assignee of the present invention. Another exemplary technology that may be similarly utilized for achieving electronics miniaturization and a compact self-shield packaging is multichip module (MCM) fabrication technology. For readers desirous of general background information regarding this chip fabrication technology, reference is made to U.S. Pat. No. 6,239,980, titled "Multimodule Interconnect Structure and Process", also commonly assigned to the same assignee of the present invention.

As will be appreciated by those skilled in the art, the foregoing technologies may be used to form relatively small, thin, light, and flexible circuits that combine multiple integrated circuits and/or passive components on a single substrate. It will be understood that the MR receiver coil elements and associated circuitry embodying aspects of the present invention may be constructed using a variety of methodologies, however, regardless of the specific methodology being utilized, the self-shielded circuitry is configured to realize a superior performance from devices, ICs, etc., such as electronic and/or electro optical circuit devices, by reducing the overall impact of the circuit packaging. As a result, one should expect not just superior EMI shielding, but also improved electrical and/or optical performance, increased volume available for electronics, increased IC packaging density, improvements in miniaturization, reduced power consumption, increased reliability, and better thermal dissipation and heat removal. For example, the coil element can be arranged to dissipate heat generated by the electronic devices housed by the coil and effectively act as a heat sink for such devices. In this case, a coil element thermally coupled to the electronic devices housed by the coil would provide triple functionality, such as signal sensing, EMI shielding, and heat sinking.

It will be appreciated that a circuit packaging embodying aspects of the present invention effectively constitutes a self-shielded "active" antenna that could be used as a transmitter antenna, receiver antenna, or both (i.e., transceiver application). Moreover, the signals sensed and/or transmitted by the self-shielded antenna need not be limited to magnetic resonance response signals since, for example, control signals could be similarly sensed and/or transmitted by this self-shielded antenna. Accordingly, the term "receiver coil" should be broadly construed to encompass sensing, receiving, transmitting and transceiving applications. Moreover, the term coil should be construed to encompass antenna functionality for signals that can involve control and/or imaging information and even more broadly for signals used for communication and/or sensing applications.

It is contemplated that in one exemplary embodiment one can use a wireless power supply arranged to provide power to operate the circuitry housed by the antenna element. For example, the wireless power supply may operate without the use of a battery or a wired connection external to the self-shielded package. For example, one may include a coil configured to pick up and convert RF signals into electrical energy. In another example, a photovoltaic cell may be configured to convert light energy into electrical energy. The wireless transmission may comprise a transmission medium without electrically conductive wires. In this way, the transmission medium does not contain electrically conductive wires that can adversely interact with the signals sensed by the sensing element or that could affect the antenna pattern of an antenna element. For example, the wireless transmission, being free of electrically conductive wires, would prevent the formation of stray currents on electrically conductive wires placed in the vicinity of an imaging patient. Exemplary modes of wirelessly transmitting signals may include RF signals transmitted through the air and light signals transmitted between an optical transmitter and receiver pair across fiber optic cables. For readers desirous of general background information regarding one exemplary innovative wireless design, reference is made to U.S. patent application Ser. No. 10/907,582, filed Apr. 6, 2005 titled "Wireless Rf Coil Power Supply", which is commonly assigned to the same assignee of the present invention.

Below are described two exemplary construction techniques that may be used for constructing receiver coil elements and associated circuitry embodying aspects of the present invention. One of such construction techniques is colloquially referred to as a "planar" construction technique and the other is colloquially referred to as a "clamshell" construction technique.

Planar Construction Technique

Mount and interconnect the circuit devices on a planar substrate, e.g., Kapton polyimide. By way of example, the various devices may be placed in their desired locations and adhered by any suitable adhesion means, such as by way of a thermoplastic adhesive layer, e.g., UItem polyetherimide resin. For example, the entire structure may be heated to the softening point of the UItem polyetherimide (in the vicinity of approximately 217 C to approximately 235 C depending on the formulation used) and then cooled to bond (e.g., thermoplastic or thermoset) the individual devices to the substrate. It is noted that the foregoing description should be construed just as one example of an affixing methodology, since other affixing techniques, e.g., specialty glass compositions, soldering, etc., may be used. For readers desirous of general background information regarding the packaging of IC chips (e.g., die) general reference is made to the book titled "Silicon Processing for the VLSI Era, Volume 1—Process Technology, $2^{nd}$ Ed. by S. Wolf and R. N. Tauber, published by Lattice Press from Sunset Beach, Calif. More specifically, reference is made to Chapter 17 titled "Assembly and Packaging for ULSI";

Create an "inner side" of a receiver coil being formed by excising (e.g., cutting) a first section of the substrate (e.g., may include circuit devices and/or interconnects) in a "strip" and attach (e.g., end-to-end) to form a desired geometric configuration, e.g., a first loop configuration having a first radius;

Create an "outer side" of the receiver coil being formed by excising (e.g., cutting) a second section of the substrate (e.g., may include circuit devices and/or interconnects) in a "strip" and attach (e.g., end-to-end) to form a desired geometric configuration, e.g., a second loop configuration having a slightly larger radius than the first loop configuration so that this second loop configuration may be concentrically arranged to circumscribe the first loop configuration and define an annulus spacing between the mutually corresponding surfaces. Assuming a circular configuration, at this stage the first and second loop configurations would essentially define concentric cylinders with an open top and an open base each;

Create a "top portion" and a "bottom portion" by excising (e.g., cutting) third and fourth sections of the substrate (e.g., may include circuit devices and/or interconnects); and Attach the third and fourth sections to the top and base of the respective inner and outer sides to form the self-shielded receiver element.

In the foregoing exemplary description, one referred to "loop" configurations, and analogized these structures to cylindrical configurations. It will be understood, however, that in the general case, the top, side, inner and outer strips may be joined in various arrangements to form the electrical interconnects and achieve any desired shape, as may be specified for a given application.

Input/output interfaces to the structure may be in the form of electrical conductors or optical fibers or any suitable interface means that maintain the structures integrity with respect to EMI shielding.

Clamshell Construction Techniques

Figure 4:
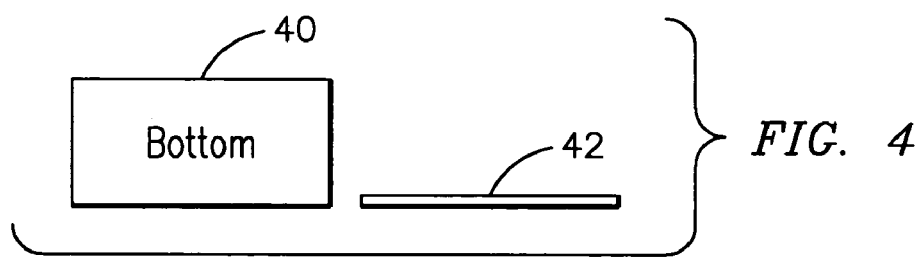
FIG. 4 is a schematic representation of one exemplary construction arrangement prior to assembly of a receiver coil element embodying aspects of the present invention.
Figure 5:
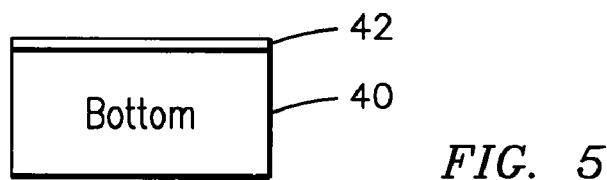
FIG. 5 shows the arrangement of FIG. 4 in assembled form.

Use a suitable process, e.g., depositing, molding, milling, thermal forming, etc. to configure a hollow structure (e.g., with one or more cavities). In one exemplary embodiment, the hollow structure may be in the form of a toroidal shaped structure, such as a hollow "doughnut". It will be understood, however, that in the general case the shape of the structure need not be toroidal since other geometries including non-circular geometries may be utilized Presuming an exemplary toroidal construction is used, split the toroidal shaped structure along a plane transverse to its axis of revolution to form a lower toroidal section and an upper toroidal section. These lower and upper toroidal sections may be conceptualized as being analogous to the upper and top sections of a clamshell. It will be appreciated that in the general case, such upper and top sections need not be symmetrical with respect to one another. For example, in FIG. 4, a lower section 40 may be configured to include all circuit devices and interconnects, etc, and may comprise a substantial portion of the entire structure, e.g., approximately 95% of the entire structure. In this case, an upper section 42 may function as a lid. One would then attach this lid to the lower section to form a self-shielded receiver coil element. FIG. 5 illustrates the lower section 40 being assembled to the upper section 42 (e.g., lid).

Figure 6:
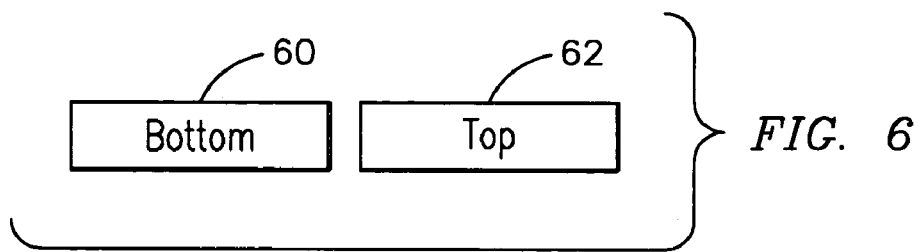
FIG. 6 is a schematic representation of another exemplary construction arrangement prior to assembly of a receiver coil element embodying aspects of the present invention.

Alternatively, as shown in FIG. 6, the top and lower sections 60 and 62 may constitute "halves" or sections of comparable size with respect to one another. For example, using an additive and/or subtractive process, one may form interconnects and attach the circuit devices onto the one or more cavities in the lower section 60, the upper section 62, or both. It is noted that die attachment can be performed prior to or subsequent to the formation of interconnects.

Figure 7:
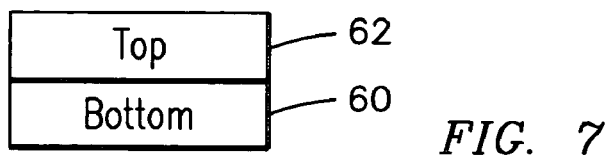
FIG. 7 shows the arrangement of FIG. 6 in assembled form.

One may then assemble the lower and upper sections to form the self-shielded receiver coil element, as seen in FIG. 7.

In another example variation of the clamshell construction, one may construct at the outset separate top and bottom structures that are joined to form the self-shielded receiver element in lieu of forming an integral hollow structure, splitting such structure and then rejoining such structure upon attachment of the circuit devices and formation of the interconnects. An exemplary sequence of steps for this variation of the clamshell construction may be as follows:

Use a suitable process, e.g., depositing, molding, milling, thermal forming, etc. to configure a hollow structure (e.g., with one or more cavities). For example, this may constitute the bottom "half" of the structure. One should be mindful that the term "half" should not be construed in a strict sense since as described above the top and bottom structures need not be equal with respect to one another;

Repeat the step above to form the top "half" of the structure.

As described above, one may form interconnects and attach the circuit devices onto the one or more cavities in the lower section, the upper section, or both.

Figure 8:
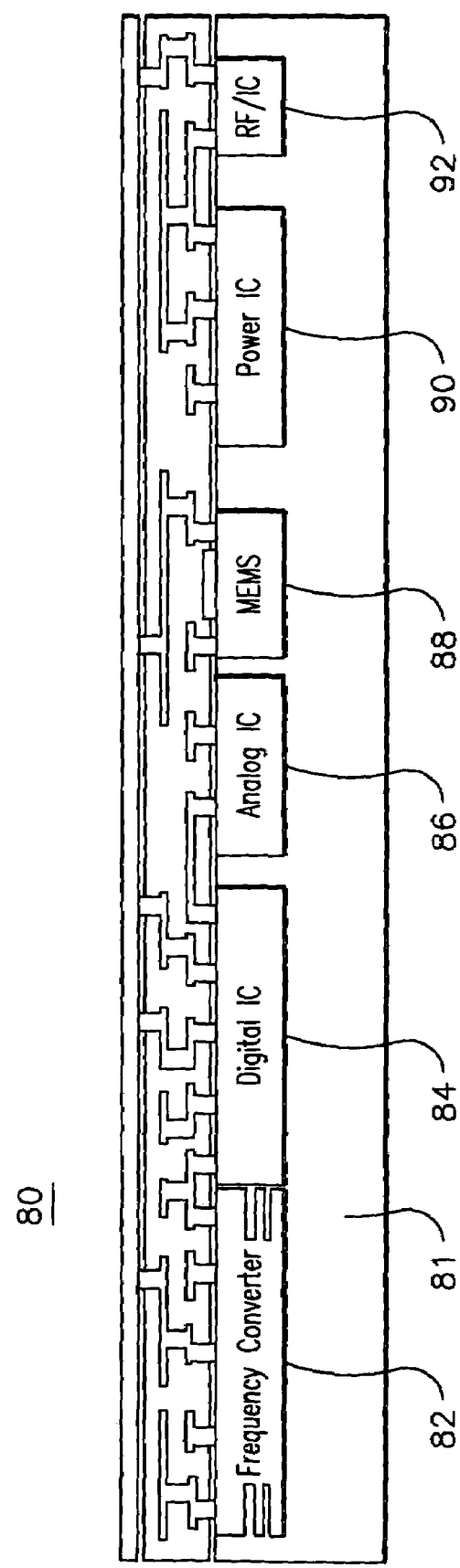
FIG. 8 is a cross-sectional view illustrating one or more exemplary integrated circuit (IC) devices and interconnects that may be constructed within a Faraday enclosure that in combination effectively constitutes an EMI-shielded active antenna.

One may then assemble the lower and upper sections to form the self shielded receiver coil element FIG. 8 illustrates a cross-sectional view of an exemplary self shielded receiver coil element 80, as may be constructed with any of the techniques described above. For example, a substrate 81 (e.g., UItem, Kapton or any suitable dielectric) may include pockets for accommodating one or more circuit devices, such as a frequency converter 82, a digital IC 84, an analog IC 86, a MEMS device 88, a power IC 90 and a radio frequency (RF) IC 92. The chips and other electronic components may be interconnected by a multilayer interconnect structure 94 including interleaved layers of a thin film polymer dielectric material and patterned metallization, with vias formed in the polymer layers.

The present invention is believed to offer at least some of the following exemplary advantages: Shielding the internal electronics from electromagnetic fields that may form around the antenna that houses such electronics. This would protect the electronics from external electrical noise. Shielding the antenna from electrical noise that may be produced by the electronics housed by the antenna. This would confine the electrical noise that may be produced by the internal electronics from getting out to the external environment, and thus avoid affecting the antenna and/or other electronic sensing devices that may be nearby. Avoiding the use of separate metal structures to enclose the electronics since the antenna itself constitutes the enclosure for the electronics. For example, the presence of metal structures near the antenna could disturb antenna functionality, such as the antenna pattern. In the event an optical fiber connection is provided, this would virtually remove all excess metal, including copper cables, from the area around the antenna and thus making possible to construct a virtually ideal antenna, with a place for housing electronic devices. Moreover aspects of the invention, may allow utilizing the relatively large surface area of the metal antenna to dissipate heat from the electronics housed by the antenna. For example, in many practical applications, the volume of the antenna would be larger than the volume of the circuit devices connected to it and the antenna can be used as a heat sink for the electronics housed therein.

While the preferred embodiments of the present invention have been shown and described herein, it will be obvious that such embodiments are provided by way of example only. Numerous variations, changes and substitutions will occur to those of skill in the art without departing from the invention herein. Accordingly, it is intended that the invention be limited only by the spirit and scope of the appended claims.

We claim as our invention:

1. A magnetic resonance (MR) imaging system comprising:
    a plurality of receiver coils configured to supply respective coil output signals based on a plurality of magnetic resonance response signals sensed by the receiver coils, wherein each receiver coil defines an enclosure, said enclosure constituting a Faraday cage; and
    at least one circuit device disposed in said enclosure to condition the coil output signal, wherein said at least one circuit device is shielded from electromagnetic interference by said enclosure.

2. The magnetic resonance (MR) imaging system of claim 1 wherein said enclosure comprises at least one output port for supplying the conditioned signal.

3. The magnetic resonance (MR) imaging system of claim 1 wherein the circuit device is selected from the group consisting of an electronics circuit device, an optical circuit device, and an electro-optical circuit device.

4. The magnetic resonance (MR) imaging system of claim 2 wherein said at least one output port for outputting the conditioned signal is selected from the group consisting of an optical port and an electrical port.

5. An imaging system comprising:
    a plurality of antennae wherein at least some of said antennae are configured to operate on a plurality of imaging response signals sensed by the antennae, wherein each antenna defines an enclosure constituting a Faraday cage; and
    at least one circuit device disposed in said enclosure to condition the imaging response signals, wherein said at least one circuit device is shielded from electromagnetic interference by said enclosure.

6. The imaging system of claim 5 wherein at least one or more of said plurality of antennae is configured to operate on one or more control signals for controlling said imaging system.

7. The imaging system of claim 5 wherein said imaging system comprises a magnetic resonance (MR) imaging system, and at least some of the plurality of antennae comprises a plurality of receiver coils configured to supply respective coil output signals based on a plurality of magnetic resonance response signals sensed by the receiver coils.

8. The imaging system of claim 5 wherein said plurality of antennae is selected from the group consisting of transmitter antennae, receiver antennae and transceiver antennae.

9. The imaging system of claim 5 wherein said enclosure comprises at least one output port for supplying the conditioned signal.

10. The imaging system of claim 5 wherein the circuit device is selected from the group consisting of an electronics circuit device, an optical circuit device, and an electro-optical circuit device.

11. The imaging system of claim 9 wherein said at least one output port for outputting the conditioned signal is selected from the group consisting of an optical port and an electrical port.

12. A magnetic resonance (MR) imaging system comprising:
    a plurality of receiver coils configured to supply respective coil output signals based on a plurality of magnetic resonance response signals sensed by the receiver coils, wherein each receiver coil comprises a flexible, multi-layer arrangement configured to define an electromagnetic shielding enclosure; and
    at least one circuit device disposed in the enclosure to condition the coil output signal, wherein said at least one circuit device is shielded from electromagnetic interference by said enclosure.

13. The magnetic resonance (MR) imaging system of claim 12 wherein at least one layer in said multi-layer arrangement comprises an electrically conductive layer, said at least one layer constituting the electromagnetic shielding enclosure.

14. The magnetic resonance (MR) imaging system of claim 12 wherein said multi-layer arrangement comprises a metal layer on a dielectric layer.

15. The magnetic resonance (MR) imaging system of claim 12 wherein at least some of the layers in said multi-layer arrangement comprise a plurality of interconnect layers.

16. The magnetic resonance (MR) imaging system of claim 12 wherein the circuit device is selected from the group consisting of an electronics circuit device, an optical circuit device, and an electro-optical circuit device.

17. An electronics system comprising:
    at least one antenna configured to sense a signal, wherein said at least one antenna defines an enclosure constituting a Faraday cage; and
    at least one circuit device electrically coupled to the antenna, said circuit device disposed in said enclosure, wherein said at least one circuit device is shielded from external electromagnetic interference by the enclosure, and further wherein said antenna is shielded from electromagnetic interference that may be generated by the circuit device by the enclosure.

18. The electronics system of claim 17 wherein said system is selected from the group consisting of a magnetic resonance (MR) imaging system, a sensing system and a communications system.

19. The electronics system of claim 17 wherein said antenna is selected from the group consisting of a transmitter antenna, a receiver antenna, a transceiver antenna and a sensing antenna.

20. The electronics system of claim 17 wherein the circuit device is selected from the group consisting of an electronics circuit device, an optical circuit device, and an electro-optical circuit device.

21. The electronics system of claim 17 further comprising a wireless power supply arranged to provide power to operate the circuit device coupled to the antenna.

22. The electronics system of claim 17 wherein the enclosure defined by the antenna is thermally coupled to the circuit device and constitutes a heat sink to the circuit device.

23. A magnetic resonance (MR) imaging system comprising:
a plurality of receiver coils configured to supply respective coil output signals based on a plurality of magnetic resonance response signals sensed by the receiver coils, wherein each receiver coil defines an enclosure, said enclosure constituting an electrically conductive structure around at least one circuit device that prevents entry or escape of an electromagnetic field; and
at least one circuit device disposed in said enclosure to condition the coil output signal, wherein said at least one circuit device is shielded from electromagnetic interference by said enclosure.

* * * * *